(12) United States Patent
Park et al.

(10) Patent No.: US 8,974,858 B2
(45) Date of Patent: Mar. 10, 2015

(54) METHOD OF DEPOSITING ORGANIC MATERIAL

(71) Applicant: Samsung Display Co., Ltd., Yongin, Gyeonggi-Do (KR)

(72) Inventors: Jae-Wan Park, Yongin (KR); You-Min Cha, Yongin (KR); Won-Seok Cho, Yongin (KR); Jae-Mork Park, Yongin (KR); Jae-Hong Ahn, Yongin (KR); Min-Jeong Hwang, Yongin (KR); Tae-Wook Kim, Yongin (KR); Jong-Woo Lee, Yongin (KR); Tae-Seung Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/944,479

(22) Filed: Jul. 17, 2013

(65) Prior Publication Data

US 2013/0309403 A1 Nov. 21, 2013

Related U.S. Application Data

(62) Division of application No. 12/762,721, filed on Apr. 19, 2010, now abandoned.

(30) Foreign Application Priority Data

May 4, 2009 (KR) .......................... 10-2009-0038907
Feb. 5, 2010 (KR) .......................... 10-2010-0010837

(51) Int. Cl.
*C23C 16/00* (2006.01)
*C23C 14/12* (2006.01)
(Continued)

(52) U.S. Cl.
CPC . *C23C 14/12* (2013.01); *B05D 1/02* (2013.01); *B05D 1/60* (2013.01);
(Continued)

(58) Field of Classification Search
CPC ..... H01L 51/0008; H01L 51/56; C23C 14/56; C23C 14/12; C23C 14/243; B05D 1/60; B05D 3/0493; B05D 1/02

USPC ........................ 427/8, 248.1, 255.6
See application file for complete search history.

(56) References Cited

U.S. PATENT DOCUMENTS 4,812,326 A 3/1989 Tsukazaki et al.
5,399,230 A 3/1995 Takatani et al.
(Continued)

FOREIGN PATENT DOCUMENTS

CN 1589492 A 3/2005
CN 1952206 A 4/2007
(Continued)

OTHER PUBLICATIONS

Taiwanese Office Action dated Aug. 15, 2013 in connection with Taiwanese patent application No. 99114032 which claims Korean patent application No. 10-2009-0038907 and No. 10-2010-0010837.
(Continued)

*Primary Examiner* — Kelly M Gambetta
(74) *Attorney, Agent, or Firm* — Robert E. Bushnell, Esq.

(57) ABSTRACT

An apparatus for depositing an organic material and a depositing method thereof, wherein a deposition process is performed with respect to a second substrate while transfer and alignment processes are performed with respect to a first substrate in a chamber, so that loss of an organic material wasted in the transfer and alignment processes can be reduced, thereby maximizing material efficiency and minimizing a processing tack time. The apparatus includes a chamber having an interior divided into a first substrate deposition area and a second substrate deposition area, an organic material deposition source transferred to within ones of the first and second substrate deposition areas to spray particles of an organic material onto respective ones of first and second substrates and a first transferring unit to rotate the organic material deposition source in a first direction from one of the first and second substrate deposition areas to an other of the first and second substrate deposition areas.

20 Claims, 11 Drawing Sheets

(51) Int. Cl.
- *B05D 1/02* (2006.01)
- *B05D 1/00* (2006.01)
- *B05D 3/04* (2006.01)
- *C23C 14/24* (2006.01)
- *C23C 14/56* (2006.01)
- *C23C 16/52* (2006.01)
- *H01L 51/00* (2006.01)
- *H01L 51/56* (2006.01)

(52) U.S. Cl.
CPC ............ *B05D 3/0493* (2013.01); *C23C 14/243* (2013.01); *C23C 14/56* (2013.01); *H01L 51/0008* (2013.01); *H01L 51/56* (2013.01)
USPC .......................... 427/255.5; 427/248.1; 427/8

(56) References Cited

U.S. PATENT DOCUMENTS

| | | | |
|---|---|---|---|
| 5,773,088 | A | 6/1998 | Bhat |
| 6,051,113 | A | 4/2000 | Moslehi |
| 6,143,082 | A | 11/2000 | McInerney et al. |
| 6,540,469 | B2 | 4/2003 | Matsunaga et al. |
| 6,884,299 | B2 | 4/2005 | Chang et al. |
| 6,932,871 | B2 | 8/2005 | Chang et al. |
| 7,309,269 | B2 | 12/2007 | Yamazaki et al. |
| 2001/0003601 | A1 | 6/2001 | Ueda et al. |
| 2003/0159651 | A1 | 8/2003 | Sakurada |
| 2004/0017408 | A1 | 1/2004 | Cok |
| 2004/0031442 | A1* | 2/2004 | Yamazaki et al. ............ 118/727 |
| 2004/0135160 | A1 | 7/2004 | Cok |
| 2005/0281950 | A1* | 12/2005 | Tanaka et al. .............. 427/248.1 |
| 2006/0186804 | A1* | 8/2006 | Sakakura et al. ............ 313/506 |
| 2007/0092635 | A1 | 4/2007 | Huh et al. |
| 2009/0139453 | A1 | 6/2009 | Chen et al. |
| 2012/0225205 | A1 | 9/2012 | Yamazaki et al. |

FOREIGN PATENT DOCUMENTS

| | | |
|---|---|---|
| JP | 2000306666 A | 11/2000 |
| JP | 2004-047452 | 2/2004 |
| JP | 200443965 A | 2/2004 |
| JP | 2004238663 A | 8/2004 |
| JP | 2005325425 A | 11/2005 |
| JP | 2006-002226 A | 1/2006 |
| JP | 20062226 A | 1/2006 |
| JP | 2006002226 A | 1/2006 |
| JP | 2007177319 | 7/2007 |
| KR | 10-2000-0053571 | 8/2000 |
| KR | 10-2003-0035942 | 5/2003 |
| KR | 10-2006-0018745 | 3/2006 |
| KR | 1020060080481 A | 7/2006 |
| KR | 1020060110451 | 10/2006 |
| WO | 03/043067 A1 | 5/2003 |
| WO | 2010114274 A2 | 10/2010 |

OTHER PUBLICATIONS

European Patent 2248595 issued on Dec. 11, 2013 which also claims Korean Patent Application 10-2009-0038907 and 10-2010-0010837 as its priority documents.

Japanese Office Action issued on Dec. 17, 2013 in connection with Japanese Patent Application Serial No. 2010-094073 which also claims Korean Patent Application 10-2009-0038907 and 10-2010-0010837 as its priority document and Request for Entry of the Accompanying Office Action attached herewith.

* cited by examiner

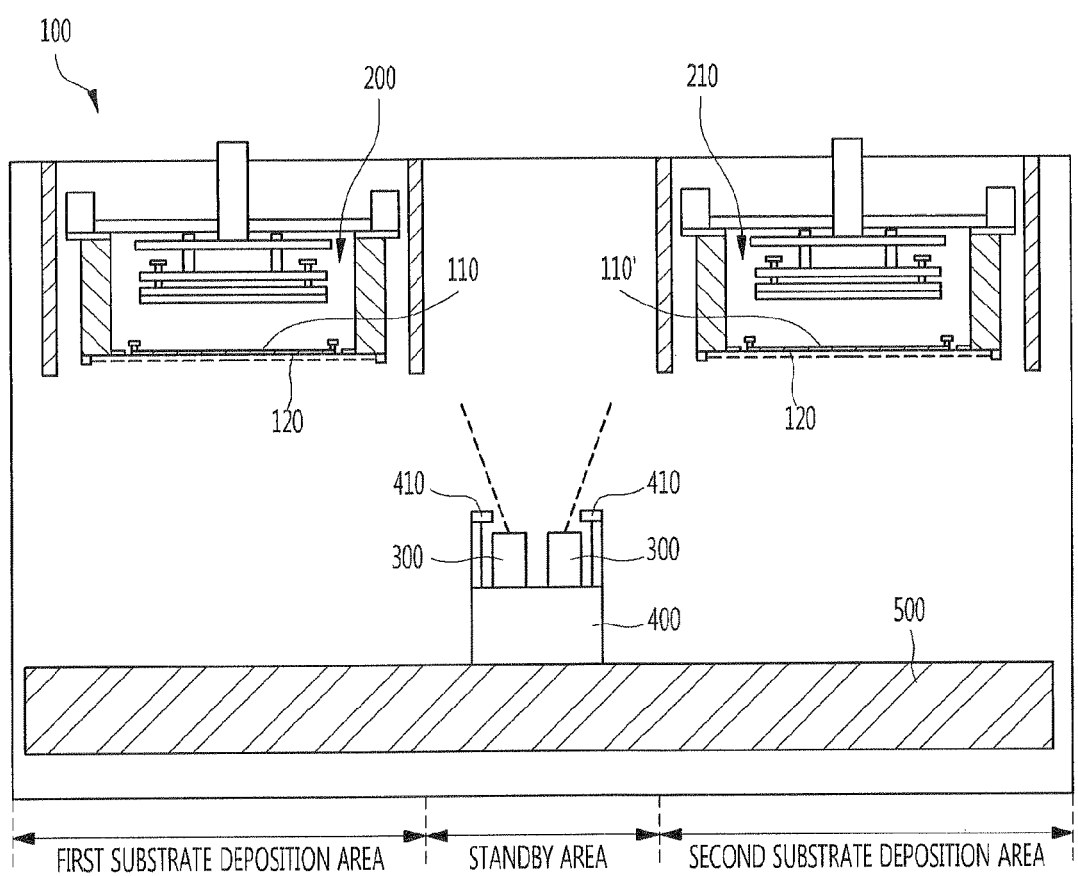

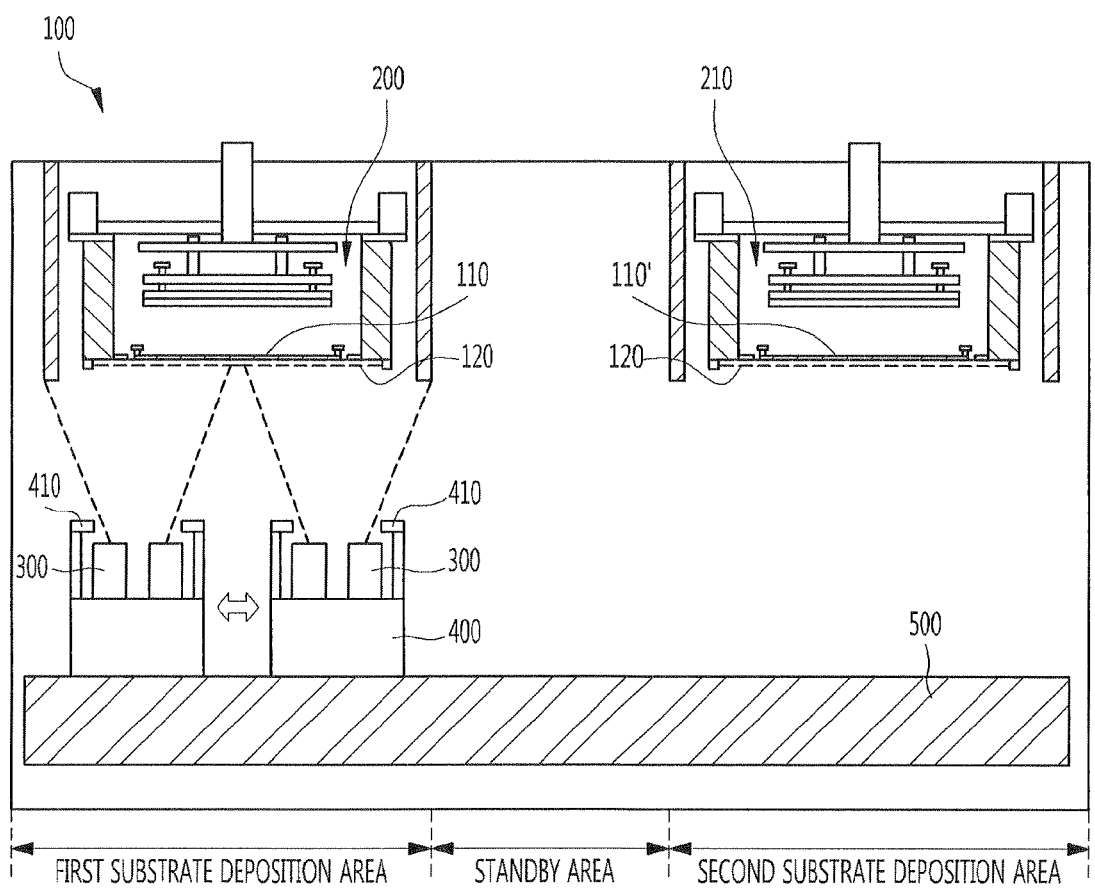

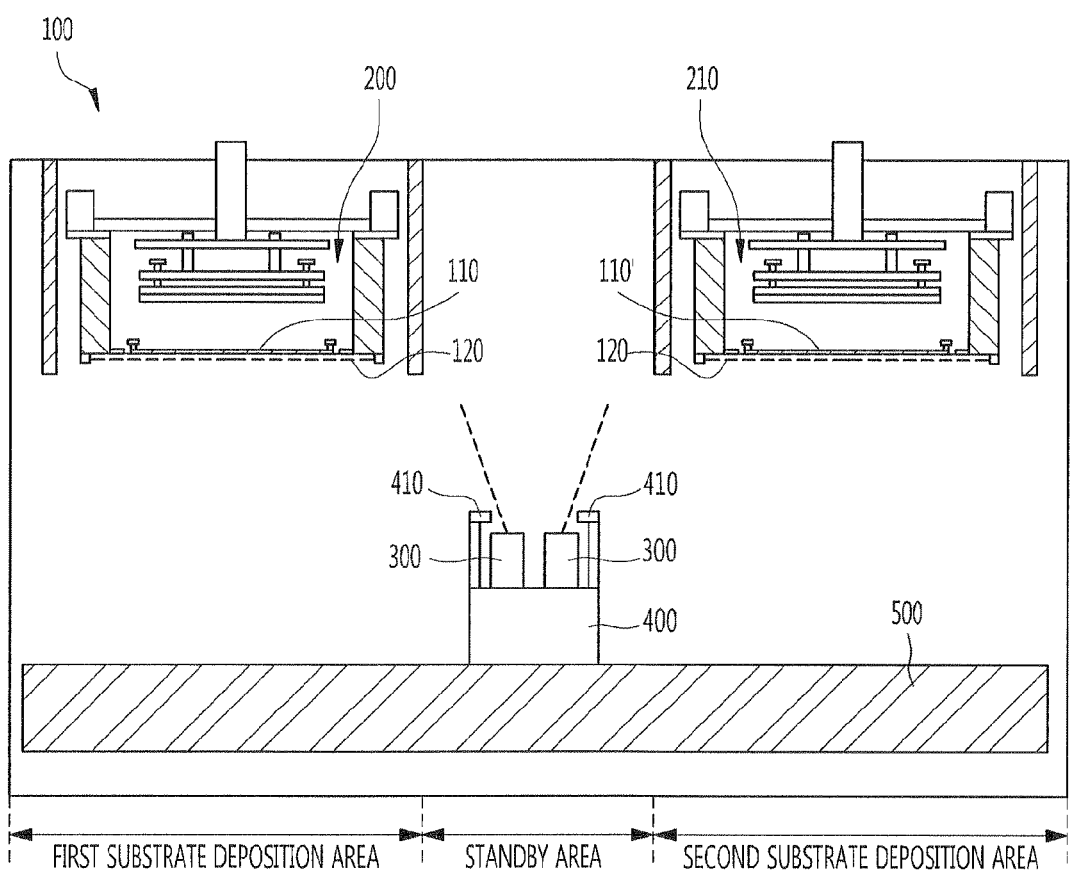

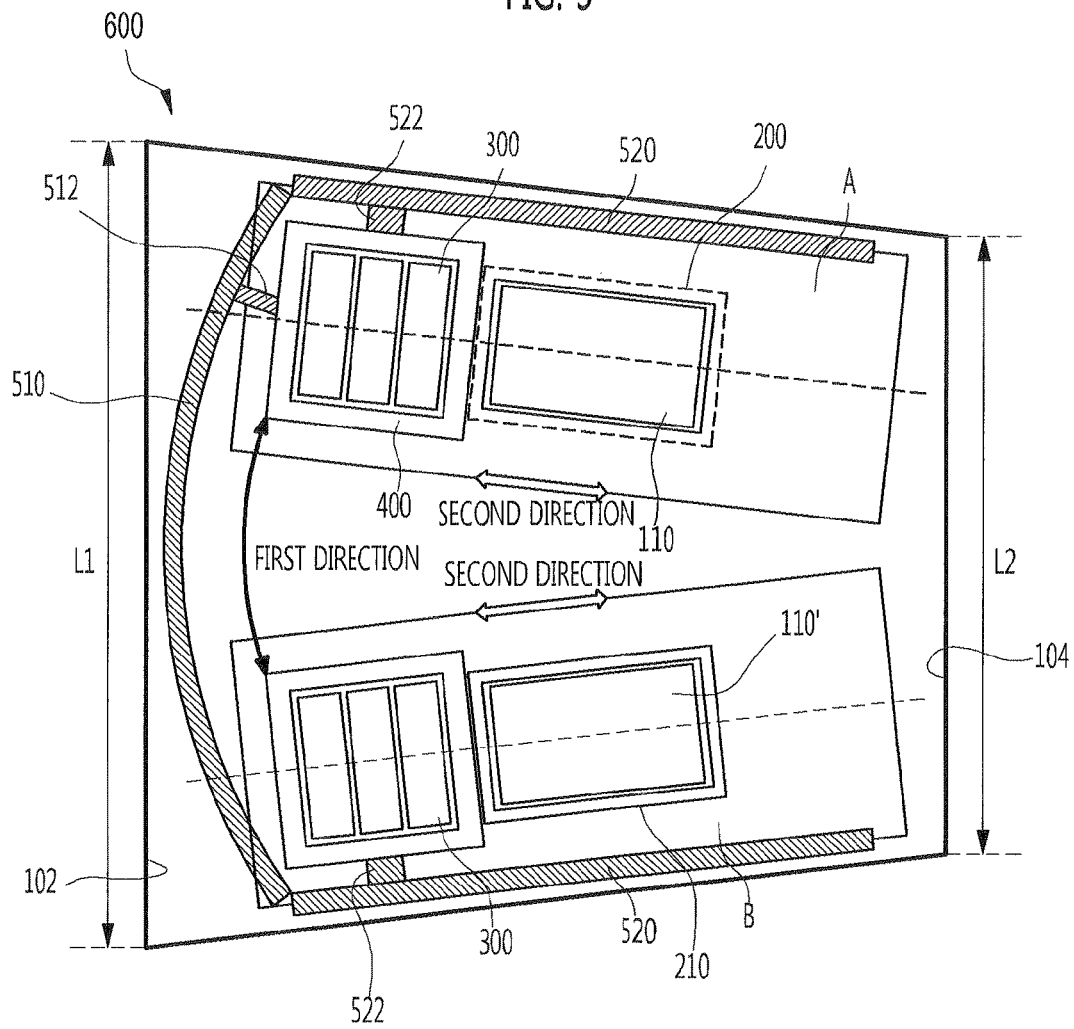

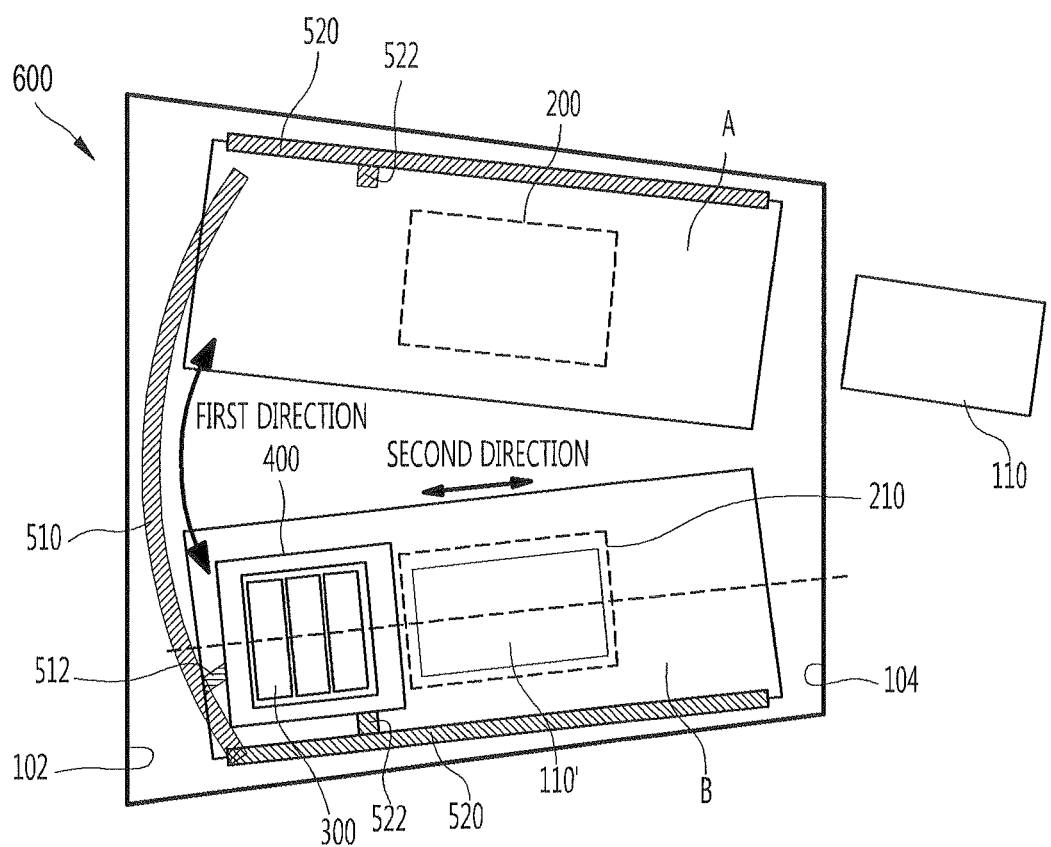

US 8,974,858 B2

METHOD OF DEPOSITING ORGANIC MATERIAL

CLAIM OF PRIORITY

This application makes reference to, incorporates the same herein, and claims all benefits accruing under 35 U.S.C. §119 from applications earlier filed in the Korean Intellectual Property Office on 4 May 2009 and there duly assigned Serial No. 10-2009-0038907 and on 5 Feb. 2010 and there duly assigned Serial No. 10-2010-0010837, respectively. Furthermore, this application is filed pursuant to 35 U.S.C. §121 as a Divisional application of Applicants' patent application Ser. No. 12/762,721 filed in the U.S. Patent & Trademark Office on 19 Apr. 2010, and assigned to the assignee of the present invention. All benefits accruing under 35 U.S.C. §120 from the aforesaid present application Ser. No. 12/762,721 are also claimed.

BACKGROUND OF THE INVENTION

1. Field of the Invention

An aspect of the present invention relates to an apparatus for depositing an organic material and a depositing method thereof that can perform a deposition process with respect to a second substrate while performing transfer and alignment processes with respect to a first substrate in the same chamber.

2. Description of the Related Art

An organic light emitting display device has come into the spotlight as a next generation self-emissive display device because of wide viewing angle, excellent contrast and fast response speed characteristics. An organic light emitting diode included in the organic light emitting display device includes first and second electrodes (anode and cathode electrodes) facing each other and an intermediate layer formed between the electrodes. The intermediate layer may include various layers, e.g., a hole injection layer, a hole transport layer, an emission layer, an electron transport layer, or an electron injection layer. In the organic light emitting diode element, such intermediate layers are organic thin films formed of an organic material.

SUMMARY OF THE INVENTION

Accordingly, there are provided an apparatus for depositing an organic material and a deposition method thereof, wherein a deposition process is performed with respect to a second substrate while transfer and alignment processes are performed with respect to a first substrate in a same chamber, so that loss of an organic material during the transfer and alignment processes can be reduced, thereby maximizing material efficiency and minimizing a processing tack time.

In addition, there is provided an organic material deposition system having more processing chambers arranged in a same space than that of earlier organic material deposition systems, the processing chambers being arranged in a direction where a deposition source moves for the deposition performance with respect to respective substrates is different from a direction where the deposition moves for the deposition of another substrate, so that the size of a chamber is optimized and space use is maximized.

According to an aspect of the present invention, there is provided a deposition apparatus that includes a chamber having an interior divided into a first substrate deposition area and a second substrate deposition area, an organic material deposition source transferred to within ones of the first and second substrate deposition areas to spray particles of an organic material onto respective ones of first and second substrates and first transferring unit to rotate the organic material deposition source in a first direction from one of the first and second substrate deposition areas to an other of the first and second substrate deposition areas. The deposition apparatus may also include a second transferring unit to reciprocate the organic material deposition source in a second direction within one of the first and second substrate deposition area. The deposition apparatus may also include a first substrate aligning unit positioned in the first substrate deposition area to align the first substrate transferred from an outside and a second substrate aligning unit positioned in the second substrate deposition area to align the second substrate transferred from the outside.

The first substrate deposition area and the second substrate deposition area may extend in a second direction that intersects the first direction. The organic material deposition source may be a linear deposition source. A body of the chamber may be a polygonal container having a first side adjacent to the first transferring unit that is longer than a second side opposite the first side. The first and second substrates may enter and exit the chamber through the second side of the chamber.

According to another aspect of the present invention, there is provided a method of depositing an organic material, which includes transferring a first substrate into a first substrate deposition area of a chamber and performing an alignment process on the first substrate, transferring a deposition source to within the first substrate deposition area to perform a deposition process on the first substrate after completion of the alignment process on the first substrate, transferring a second substrate into a second substrate deposition area of the chamber and performing an alignment process on the transferred second substrate while the deposition process on the first substrate is being performed, transferring the deposition source to the second substrate deposition area by rotating the deposition source in a first direction when the deposition process on the first substrate and the alignment process on the second substrate are completed and transferring the deposition source within the second substrate deposition area to perform the deposition process on the second substrate. The method may also include transferring a third substrate into the first substrate deposition area of the chamber and performing an alignment process with respect to the third substrate while performing the deposition process with respect to the second substrate.

According to still another aspect of the present invention, there is provided an apparatus, which includes a chamber having an interior divided into a first substrate deposition area, a standby area, and a second substrate deposition area, a first substrate aligning unit positioned in the first substrate deposition area to align a first substrate transferred from an outside, a second substrate aligning unit positioned in the second substrate deposition area to align a second substrate transferred from the outside, at least one organic material deposition source to spray particles of an organic material onto ones of the first and second substrates and a transferring unit to transfer the organic material deposition source in a first direction. The apparatus may also include a deposition source holding unit to hold the organic material deposition source and an angle limiting plate arranged on an upper outer wall of the deposition source holding unit. The first substrate deposition area, the standby area, and the second substrate deposition area may be arranged in a line extending in the first direction.

According to still another aspect of the present invention, there is provided a method of depositing an organic material, which includes positioning a deposition source in a standby area of a chamber while a first substrate is transferred from an outside into a first substrate deposition area of the chamber and while an alignment process is being performed on the first substrate, performing a deposition process with respect to the first substrate by transferring the deposition source positioned in the standby area of the chamber into the first substrate deposition area after the alignment process with respect to the first substrate is completed, transferring a second substrate from an outside into a second substrate deposition area and performing an alignment process with respect to the second substrate, transferring the deposition source from the first substrate deposition area back to the standby area of the chamber after the deposition process with respect to the first substrate is completed and performing a deposition process with respect to the second substrate by transferring the deposition source positioned in the standby area of the chamber into the second substrate deposition area after the alignment process with respect to the second substrate is completed. The alignment process with respect to the second substrate may be performed while the deposition process is being performed with respect to the first substrate. The method may also include transferring the first substrate from the first substrate deposition area of the chamber to the outside upon completion of the deposition process on the first substrate and transferring a third substrate into the first substrate deposition area of the chamber from the outside.

According to still another aspect of the present invention, there is provided a deposition system, which includes a plurality of organic material deposition apparatuses, a transfer chamber to commonly connect the plurality of organic material deposition apparatuses and a load lock chamber to load and/or unload substrates inserted into the organic material deposition apparatuses through the transfer chamber, wherein the plurality of organic material deposition apparatuses comprises a first organic material deposition apparatus to perform a deposition process with respect to at least two substrates and to perform transfer and an alignment processes of at least one of the at least two substrates while performing the deposition process with respect to an other of the at least two substrates. The plurality of organic material deposition apparatuses may further include a second organic material deposition apparatus to sequentially perform a transfer process, an alignment process, and a deposition process with respect to a single substrate.

The first organic material deposition apparatus may include a chamber having an interior divided into a first substrate deposition area and a second substrate deposition area, an organic material deposition source transferred to within ones of the first and second substrate deposition areas to spray particles of an organic material onto respective ones of first and second substrates and a transferring unit to rotate the organic material deposition source in a first direction from one of the first and second substrate deposition areas to an other of the first and second substrate deposition areas. The chamber may be a polygonal container having a first side adjacent to the first transferring unit that is longer than a second side opposite the first side. The first and second substrates may enter and exit the chamber through the second side of the chamber.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein:

FIG. 1 is a cross-sectional view schematically illustrating the configuration of an apparatus for depositing an organic material according to a first embodiment of the present invention;

FIGS. 2A to 2D are views illustrating a method of depositing an organic material according to the first embodiment of the present invention using the apparatus of FIG. 1;

FIG. 3 is a view illustrating an apparatus for depositing an organic material according to a second embodiment of the present invention;

FIGS. 4A to 4D are views illustrating a method of depositing an organic material according to the second embodiment of the present invention using the apparatus of FIG. 3.

DETAILED DESCRIPTION OF THE INVENTION

Figure 2A:
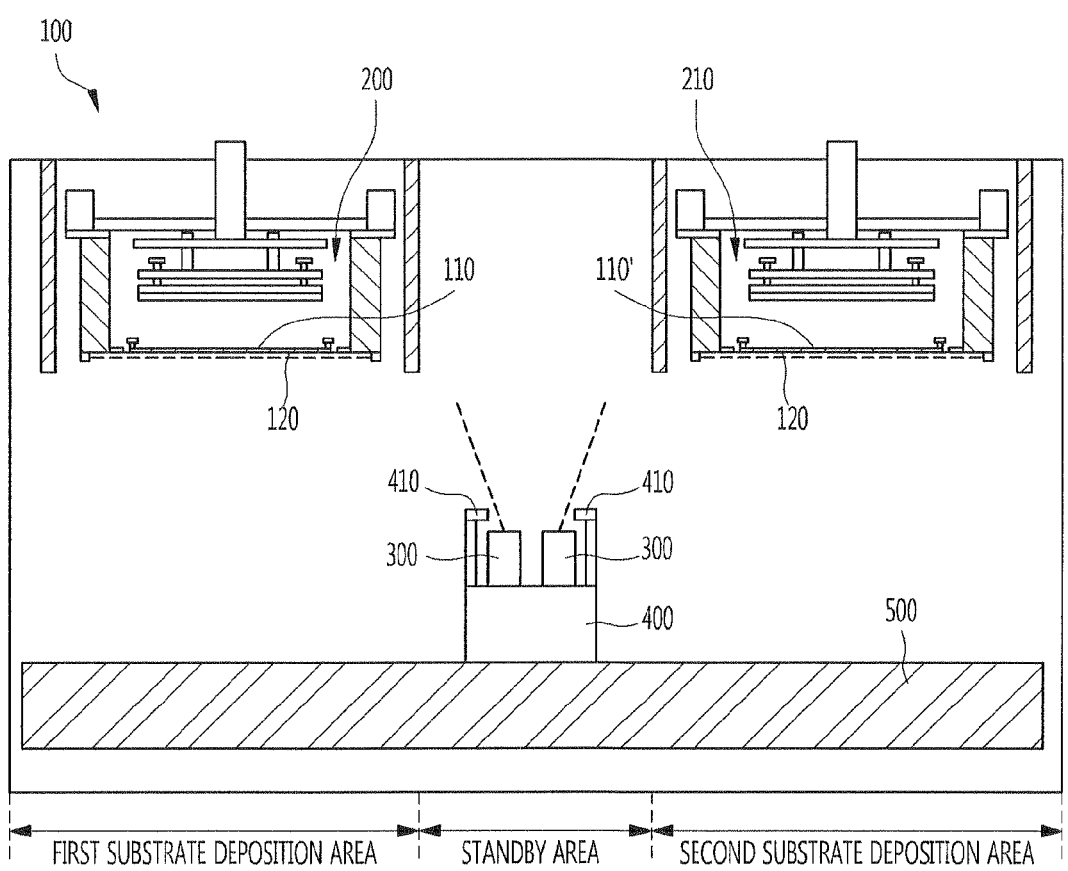

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

An organic light emitting display device has come into the spotlight as a next generation self-emissive display device because of wide viewing angle, excellent contrast and fast response speed characteristics. An organic light emitting diode included in the organic light emitting display device includes first and second electrodes (anode and cathode electrodes) facing each other and an intermediate layer arranged between the electrodes. The intermediate layer may include various layers, e.g., a hole injection layer, a hole transport layer, an emission layer, an electron transport layer, and/or an electron injection layer. In the organic light emitting diode element, such intermediate layers are organic thin films made out of an organic material.

In the process of manufacturing an organic light emitting diode element having the aforementioned configuration, organic thin films and electrodes including a hole injection layer, a hole transport layer, an emission layer, an electron transport layer, an electron injection layer and the like may be formed on a substrate through a deposition method using a deposition apparatus.

In the deposition method, after loading a substrate into a vacuum chamber, a thin film is formed by heating a container containing an organic material to be deposited and then evaporating or sublimating the organic material in the container. An organic thin film is deposited on the substrate by aligning a shadow mask pattern having an opening with a desired shape in front of the substrate and then evaporating or sublimating the organic material.

Before such a deposition process is performed, a process of transferring a substrate into a chamber, a process of precisely aligning a shadow mask to the substrate, and the like are necessarily performed. According to earlier deposition apparatus and method, the deposition process is impossible during the substrate transfer and mask alignment processes. Further, the substrate transfer and mask alignment processes are separated from the deposition process. Therefore, a processing tack time may be increased.

In addition, according to earlier deposition apparatus and method, the organic material is continuously evaporated or sublimated from a deposition source during the substrate transfer and mask alignment processes. Therefore, the organic material may be wasted.

Turning now to FIG. 1, FIG. 1 is a cross-sectional view schematically illustrating the configuration of an apparatus for depositing an organic material according to a first embodiment of the present invention. Referring to FIG. 1, the apparatus for depositing an organic material according to the first embodiment of the present invention includes a chamber 100 having an interior divided into a first substrate deposition area, a standby area and a second substrate deposition area, a first substrate aligning unit 200 positioned in the first substrate deposition area to align a first substrate 110 transferred from the outside, a second substrate aligning unit 210 positioned in the second substrate deposition area to align a second substrate 110' transferred from the outside, at least one organic material deposition source 300 for spraying particles of the deposition material onto the first and second substrates 110 and 110', a deposition source holding unit 400 for holding the organic material deposition source 300, and a transferring unit 500 for transferring the deposition source holding unit in a first direction (for example, a horizontal direction). As illustrated in FIG. 1, the first substrate deposition area, the standby area, and the second substrate deposition area are arranged in a line in the first direction.

Here, a vacuum state is maintained within the chamber 100 by a vacuum pump (not shown). Two organic material deposition sources 300 are held in the deposition source holding unit 400 in the first embodiment of FIG. 1, and an angle limiting plate 410 is formed on the upper outer wall of the deposition source holding unit 400. Accordingly, the angle limiting plate 410 functions to limit the spraying direction of the organic material sprayed from the organic material deposition source 300.

The transferring unit 500 functions to transfer the deposition source holding unit 400 in the first direction (in a horizontal direction). The transferring unit 500 controls the deposition source holding unit 400 to be initially positioned in the standby area of the chamber 100. Then, when the alignment of the first substrate 110 is completed by the first substrate aligning unit 200, the transferring unit 500 transfers the deposition source holding unit 400 to the first substrate deposition area to perform a deposition process on the first substrate 110.

Thereafter, when the alignment of the second substrate 110' is completed by the second substrate aligning unit 210, the transferring unit 500 transfers the deposition source holding unit 400 to the second substrate deposition area to perform a deposition process on the second substrate 110'.

That is, transfer and alignment processes are performed with respect to the second substrate 110' while a deposition process is being performed with respect to the first substrate 110. Conversely, transfer and alignment processes are performed with respect to the first substrate 110 while a deposition process is being performed with respect to the second substrate 110'. Accordingly, a processing tack time can be considerably reduced and the amount of waste of organic material is also reduced, so that material efficiency can be maximized.

The transferring unit 500 is preferably implemented so that the use of the transferring unit 500 can be suitable in the chamber 100 maintained in the vacuum state, and that the transfer speed of the organic material deposition source 300 can be controlled depending on processing conditions. The transferring unit 500 may include a ball screw (not shown), a motor (not shown) for rotating the ball screw, and a guide (not shown) for guiding the deposition source holding unit 400, however this description is provided only for illustrative purposes. In another embodiment, the transferring unit 500 may be implemented so that the organic material deposition source 300 can be driven at a constant speed using a linear motor (not shown).

In addition, a mask pattern 120 for determining the shape of the organic material to be deposited is positioned at the front sides of the first and second substrates 110 and 110', i.e., between the organic material deposition source 300 and the first and second substrates 110 and 110'. Accordingly, the organic material evaporated from the organic material deposition source 300 is deposited onto the first and second substrates 110 and 110' while passing through the mask pattern 120, so that an organic film with a predetermined shape is formed on the first and second substrates 110 and 110'.

Meanwhile, the organic material deposition source 300 contains within an organic material to be deposited on the first and second substrates 110 and 110' and heats the received organic material to evaporate the organic material. Then, the organic material deposition source 300 sprays the evaporated organic material onto the first and second substrates 110 and 110' so that an organic film is formed on the first and second substrates 100 and 110'. The organic material deposition source 300 may be implemented as a linear deposition source or a point deposition source.

It is to be appreciated that it is difficult for the point deposition source to perform the depositions of the organic material on a large area. For the deposition of the organic material on the large area, several point deposition sources must be arranged. When many point sources are used, it is difficult to control the plurality of point deposition sources. Accordingly, in the embodiment of the present invention, the organic deposition source 300 is preferably implemented as a linear deposition source.

Turning now to FIGS. 2A through 2D, FIGS. 2A through 2D are views illustrating a method of depositing an organic material according to a first embodiment of the present invention, which is performed by the apparatus for depositing an organic material as illustrated in FIG. 1. As illustrated in FIG. 2A, after the first substrate 110 is transferred into the chamber 100 and before the alignment process is completed on the first substrate 110, the deposition source holding unit 400 holding the organic material deposition source 300 is positioned in the standby area, which is a central area of the chamber 100. To transfer a substrate into the chamber 100, a robot arm (see FIG. 5) and a transfer chamber (see FIG. 5) are connected to the chamber 100 of a cluster type deposition.

The organic deposition source 300 keeps evaporating and spraying the organic material, even when being positioned in the standby area. However, when the organic material deposition source 300 is positioned in the standby area, organic material is not being deposited on either of the first or the second substrate 110 or 110'. Therefore, while first or second substrate 110 or 110' is being aligned, the angle limiting plate 410 provided on the upper outer wall of the deposition source holding unit 400 blocks the evaporated organic material from reaching either of the first or second substrate 110 or 110'.

That is, in the embodiment of the present invention, the angle limiting plate 410 is provided on the upper outer wall of the deposition source holding unit 400 so that a barrier layer provided in earlier deposition apparatuses is no longer necessary. The barrier layer is provided in earlier deposition apparatuses and is formed between the substrate and the organic material deposition source to prevent the organic material from being depositing on the substrate while the alignment process of the substrate is being performed.

When the alignment on the first substrate 110 is completed by the first substrate aligning unit 200, the deposition source holding unit 400 positioned in the standby area of the chamber 100 as illustrated in FIG. 2A is transferred to the first substrate deposition area as illustrated in FIG. 2B so that the first substrate 110 faces the organic material deposition source 300 so that the deposition process can be performed on the first substrate 110. As illustrated in FIG. 2B, in the first embodiment, deposition source 300 moves in the same first direction within the first substrate deposition area during the deposition onto the first substrate 110.

However, in the embodiment of the present invention, the second substrate 110' is transferred to the second substrate deposition area of the chamber from an outside and the alignment process of the transferred second substrate 110' is performed by the second substrate aligning unit 210 while the deposition process with respect to the first substrate 110 is carried out. That is, the transfer and the alignment processes of the second substrate 110' are performed simultaneously with the deposition process with respect to the first substrate 110.

Next, when the deposition process with respect to the first substrate 110 is completed, the source holding unit 400 is transferred back into the standby area of the chamber 100 by transfer unit 500 as illustrated in FIG. 2C, and the first substrate 110 is removed from the chamber 100. The removal of first substrate 110 is implemented by the robot arm provided in the transfer chamber as described above and as illustrated in FIG. 5.

Figure 2D:
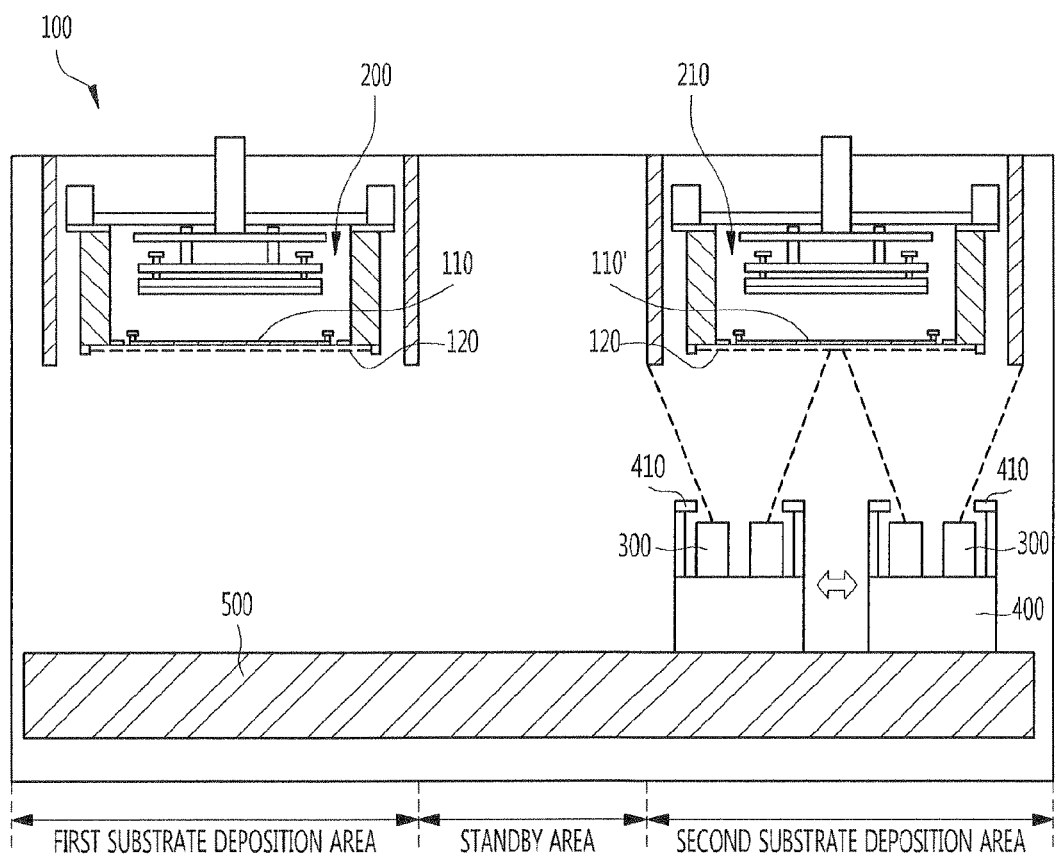

When the alignment with respect to the second substrate 110' is completed, the deposition source holding unit 400 positioned in the standby area of the chamber 100 is transferred to the second substrate deposition area as illustrated in FIG. 2D by the transfer unit 500 and the deposition process is performed within the second substrate deposition area. In this embodiment, deposition is performed on second substrate 110' while a new third substrate is transferred into the chamber and into the first substrate deposition area and is aligned by the first substrate aligning unit 200. While organic material is being deposited onto second substrate 110', deposition source is moved in the same direction (i.e., the first direction) as when moved from ones of the standby area and the first and second substrate deposition areas. As will be described later in the second embodiment of FIGS. 3 through 4D, this is not the most efficient use of space as the chamber 100 according to the first embodiment must be designed to extend an extra large distance in the first direction when the direction of translation of the deposition source in between depositions is the same as direction of movement of the deposition source 300 during a deposition.

When the deposition process with respect to the second substrate 110' is completed, the deposition source holding unit 400 is transferred again back to the standby area of the chamber 100 by the transfer unit 500 as illustrated in FIG. 2A and the second substrate 110' is removed from the chamber and a new fourth substrate is transferred into the chamber and to the second substrate deposition area.

According to the method in accordance with the first embodiment of the present invention, the deposition process with respect to the second substrate 110' is performed while the transfer and the alignment processes with respect to the first substrate 110 are performed in the same chamber so that waste of organic material is reduced and throughput can be increased, thereby maximizing material efficiency and minimizing a processing tack time.

However, in the first embodiment of the present invention as illustrated in FIGS. 1 through 2D, since the direction that the deposition source 300 moves during a deposition process is the same as the direction that the deposition source 300 moves when going from the first substrate deposition area to the second substrate deposition area (or from the second substrate deposition area to the first substrate deposition area) to perform the deposition with respect to another substrate, the width of the chamber 100 must be increased in the direction that the deposition process is performed (the first direction).

That is, since the deposition source 300 is transferred in the same first direction (horizontal direction) as the deposition performance direction when the deposition source 300 is transferred to perform the deposition on the second substrate 110' after the deposition with respect to the first substrate 110 is completed, the chamber length must be increased about two times in the first direction (horizontal direction) to allow for the deposition with respect to the first and second substrates 110 and 110'.

Therefore, in the second embodiment of the present invention, the direction that the deposition source moves during a deposition is different from the direction that the deposition source is moved to get from one substrate deposition area to another. By designing the chamber as such according to the second embodiment of the present invention, the size and shape of the chamber results in optimum space efficiency and the above-mentioned problem will be solved.

Turning now to FIG. 3, FIG. 3 is a view illustrating an apparatus for depositing an organic material according to a second embodiment of the present invention. However, since the shadow mask and the deposition source are identical to those in the first embodiment of the present invention as illustrated in FIG. 1, their descriptions will be omitted and same elements are assigned with same reference numerals for illustrative purposes.

Referring to FIG. 3, an apparatus for depositing an organic material according to the second embodiment of the present invention includes a chamber 600 having an interior divided into a first substrate deposition area A and a second substrate deposition area B, a first substrate aligning unit 200 positioned in the first substrate deposition area A to align a first substrate 110 transferred from the outside, a second substrate aligning unit 210 positioned in the second substrate deposition area B to align a second substrate 110' transferred from the outside, at least one organic material deposition source 300 for spraying particles of the organic material onto the first and second substrates 110 and 110', a deposition source holding unit 400 for holding the organic material deposition source 300, a first transferring unit 510 for rotating the organic material deposition source in a first direction to move the organic material deposition source 300 from one of a first and second substrate deposition area to another of a first and second deposition area, and a second transferring unit 520 for transferring the deposition source holding unit 400 in a second direction within one of the first and second substrate deposition areas.

Here, a vacuum state is maintained within the chamber 600 by a vacuum pump (not shown). The transfer and carrying of the substrate into the chamber 600 are implemented by a robot arm (see FIG. 5) provided in a transfer chamber (see FIG. 5) connected to the chamber 600 of a cluster type deposition system.

The first substrate deposition area A and the second substrate deposition are B, as illustrated, are arranged almost in parallel to each other near the second direction, wherein the deposition of the substrates performed in the respective deposition areas A and B is performed by which the deposition source holding unit 400 holding the deposition source 300 is reciprocated in the second direction by the second transferring unit 520.

When deposition on the first substrate 110 is completed in the first substrate deposition area A, the deposition source holding unit 400 is rotated in the first direction by the first transferring unit 510 so that it is positioned within the second substrate deposition area B, and then the deposition source holding unit 400 is reciprocated in the second direction by the second transferring unit 520 during the deposition on the second substrate 110'.

Similarly, when the deposition of the second substrate 110' is completed in the second substrate deposition area B, the deposition source holding unit 400 is rotated in the first direction by the first transferring unit 510 so that it is positioned within the first substrate deposition area A, and then the deposition source holding unit 400 is reciprocated in the second direction by the second transferring unit 520 during deposition on a newly entered third substrate.

The first and second transferring units 510 and 520 are preferably implemented so that the use of the first and second transferring units 510 and 520 can be suitable in the chamber 600 maintained in the vacuum state, and that the transfer speed of the organic material deposition source 300 can be controlled depending on processing conditions. The first and second transferring units 510 and 520 may include holders 512 and 522 for holding each substrate, a ball screw (not shown), a motor (not shown) for rotating the ball screw, and a guide (not shown) for guiding the deposition source holding unit 400, however, this description is provided only for illustrative purposes. In another variation, the transferring units 510 and 520 may be implemented so that the organic material deposition source 300 can be driven at a constant speed using a linear motor (not shown).

In the first embodiment described with reference to FIGS. 1 through 2D, since the deposition source is transferred to perform the deposition of the respective substrates in the chamber in the same direction (horizontal direction) as the direction the deposition source is transferred when being moved from one substrate deposition area to the other, the width of the chamber must be increased about two times in the first direction that the deposition source moves. However, in the embodiment as illustrated in FIG. 3, the direction that the deposition source is transferred to perform the deposition of the respective substrates (second direction) is different from the direction that the deposition source 300 is transferred to move from one substrate deposition area to the other (first direction), so that the size and shape of chamber 600 of the second embodiment of the present invention is more space efficient than the process chamber 100 of the first embodiment of the present invention.

However, to this end, in the embodiment as illustrated in FIG. 3, the body of the chamber 600 is implemented as a polygonal container having a length L1 on a first side 102 longer than a length L2 on a second side 104 such that the first transferring unit 510 can be rotated in the first direction and accordingly, the increase of the width of the chamber 600 can be minimized. Although the body of the chamber 600 is depicted as a polygonal container in the embodiment as illustrated in FIG. 3, this is provided only for illustrative purposes. The body of the chamber can instead be implemented as a pentagonal container in which the first side 102 is bent.

In this case, the first side 102 is adjacent to the first transferring unit 510 and the second side 104 is opposite to the first side 102, wherein the transfer and the carrying of the substrates into and out of chamber 600 are performed on the second side 104. As a result, the second side 104 has an opening (not shown) such that the transfer and the carrying of the substrates can be performed.

Figure 4A:
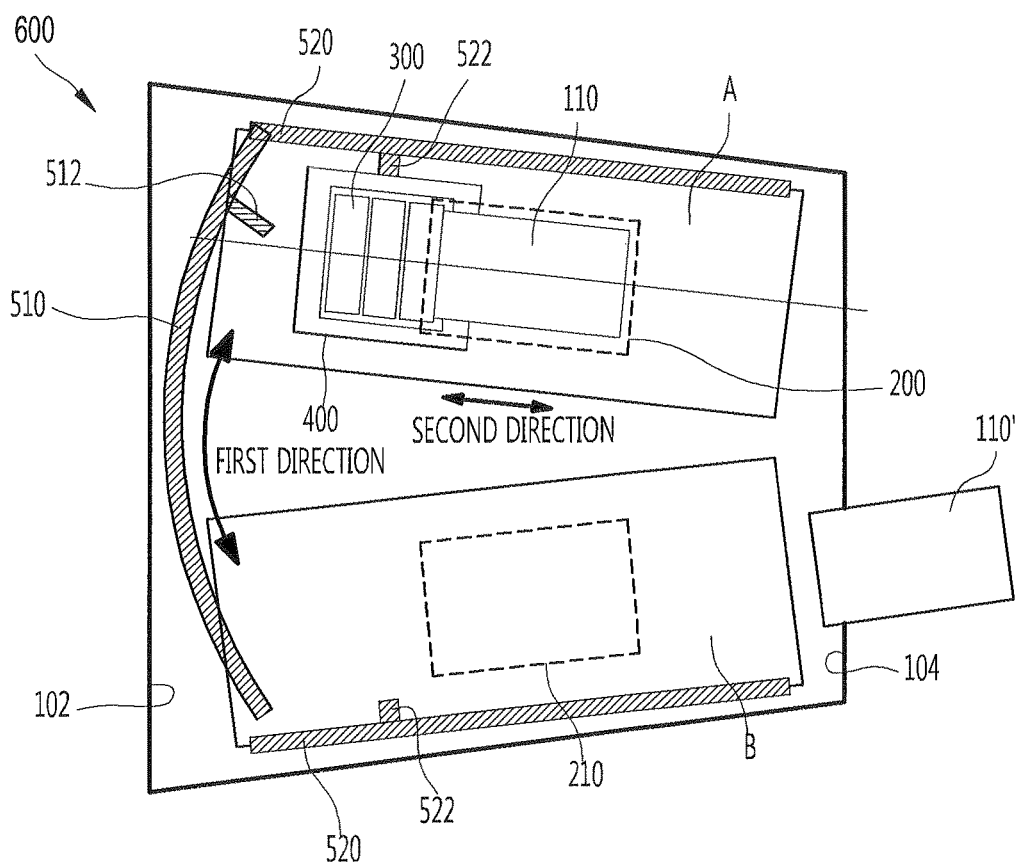

Hereinafter, the method of depositing an organic material performed by the apparatus illustrated in FIG. 3 will be described in detail with reference to FIGS. 4A to 4D. Referring to FIG. 4A, a first substrate 110 is transferred into the chamber 600 through an opening (not shown) formed in the second side 104 of the body of the chamber 100. Then, an alignment process is performed by the first substrate aligning unit 200. Then, the deposition source holding unit 400 is reciprocated in the second direction within the first substrate deposition area A by the second transferring unit 520 positioned in the first substrate deposition area A so that the deposition process on the first substrate 110 can be performed.

Figure 4B:
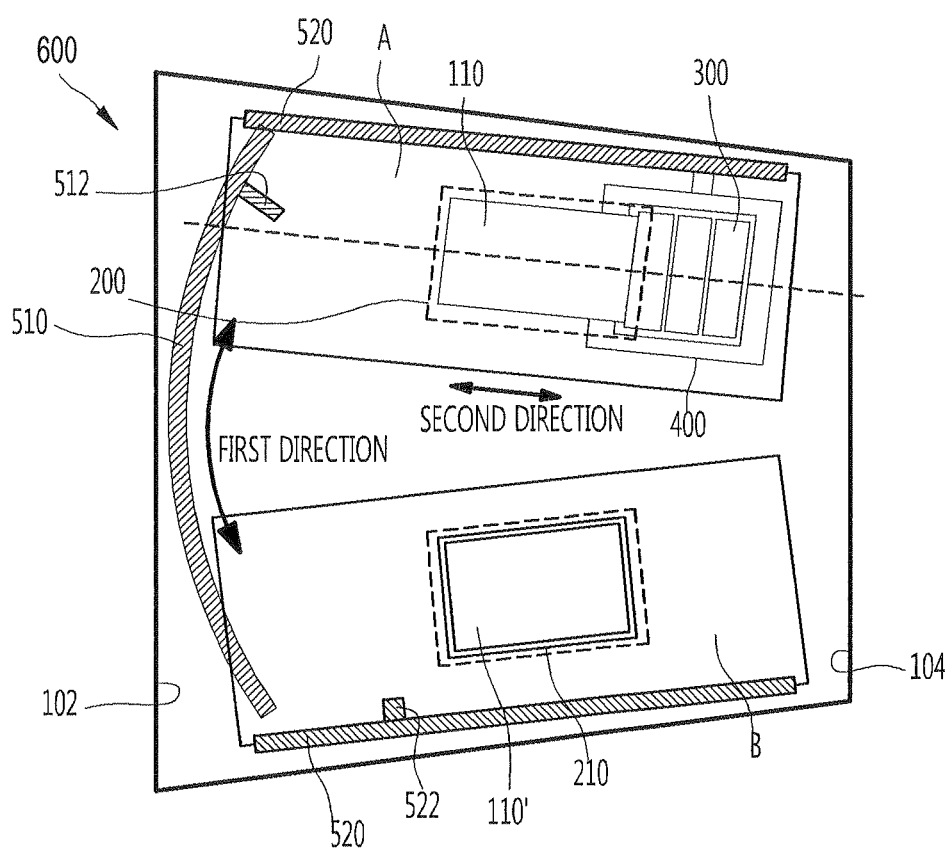

During the deposition process with respect to the first substrate 110, the second substrate 110' is transferred into the chamber 600 through the opening (not shown) formed in the second side 104 and as illustrated in FIG. 4B, and an alignment process is performed by the second substrate aligning unit 210.

At this time, the first substrate aligning unit 200 and the second substrate aligning unit 210 are respectively positioned in the first substrate deposition area A and the second substrate deposition area B, and since configuration thereof is identical to that as illustrated in FIG. 1, the description will be omitted. That is, in the embodiment of the present invention, the transfer and the alignment process of the second substrate 110' are performed simultaneously and within the same chamber 600 as the deposition of organic material onto the first substrate 110.

When the deposition process on the first substrate 110 and the alignment process on the second substrate 110' are completed, the deposition source holding unit 400, as illustrated in FIG. 4C, is rotated in the first direction by the first transferring unit 510 so that it is positioned within the second substrate deposition area B. At this time, the first substrate 110, upon which the deposition process is completed, is removed from chamber 600 and a new first substrate 110 (hereinafter a third substrate) enters the first substrate deposition area A of the chamber 600 for alignment. Because the deposition source holding unit 400 containing the organic material deposition source 300 is rotated from the first substrate deposition area A to the second substrate deposition area B by the first transferring unit 510 in a first direction that is essentially orthogonal to the second direction, the width of the chamber 600 can be remarkably reduced in comparison to the chamber 100 of the first embodiment of FIGS. 1 through 2D.

Figure 4D:
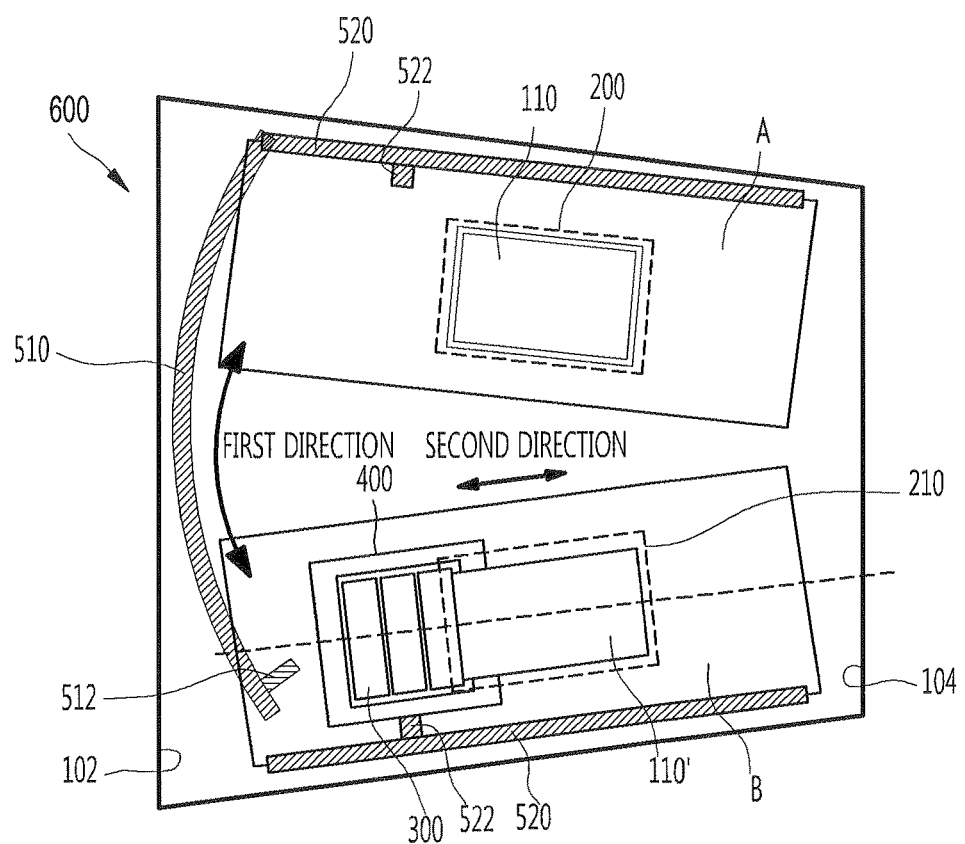

That is, as illustrated in FIGS. 3 through 4D, in the second embodiment of the present invention, the chamber 600 is implemented as a polygonal container having the length L1 on the first side 102 longer than the length L2 on the second side 104 to enable the deposition source holding unit 400 and the organic material deposition source 300 to be rotated so that spatial use can be maximized.

After the deposition source holding unit 400 is positioned in the second substrate deposition are B as illustrated in FIG. 4D, the source holding unit 400 reciprocates in the second direction within the second substrate deposition area B so that the deposition process on the second substrate 110' can be performed.

In addition, the alignment process of the third substrate that is newly transferred into the chamber 600 is performed by the first substrate aligning unit 200 positioned in the first substrate deposition area A simultaneously with the deposition process on the second substrate 110' in the second substrate deposition area B being carried out. That is, in the second embodiment of the present invention, the transfer and the alignment processes of the new first substrate 110 (aka third substrate) are performed in the same chamber 600 and at the same time that the deposition process on the second substrate 110' is being performed. When the deposition process on the second substrate 110' is completed, the process sequence as illustrated in FIGS. 4A through 4D are repeated and the deposition and alignment processes of the respective substrates are performed.

Figure 5:
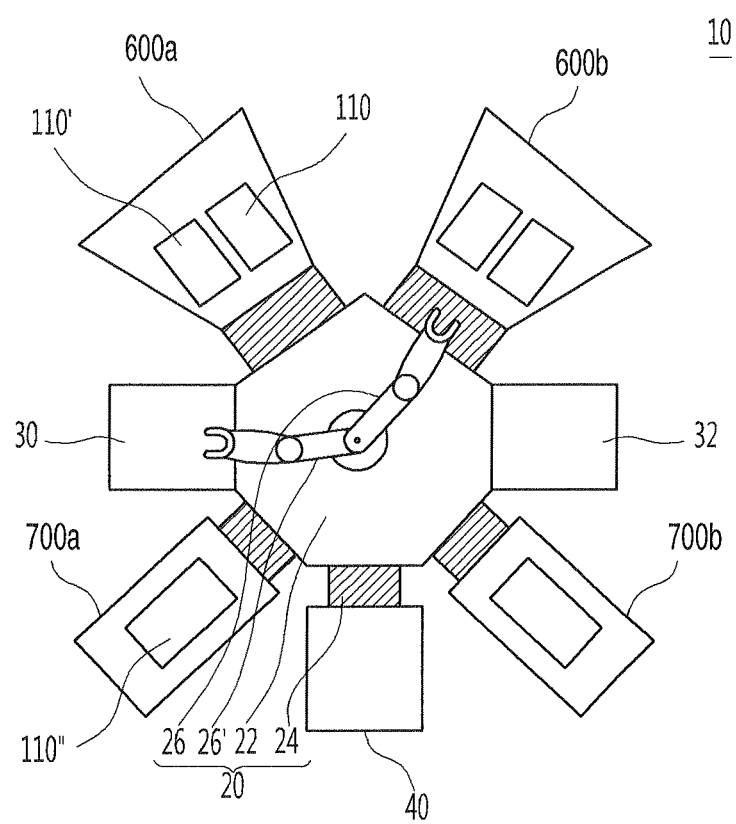
FIG. 5 is a block diagram schematically of an organic material deposition system according to a third embodiment of the present invention that includes an organic material deposition apparatus according to the second embodiment of the present invention.

Turning now to FIG. 5, FIG. 5 is a block diagram schematically illustrating an organic material deposition system 10 including an organic material deposition apparatus according to a third embodiment of the present invention. The organic material deposition system 10 as illustrated in FIG. 5 is provided with process chambers 600*a* and 600*b* analogous in design to process chamber 600 of FIG. 3. Specifically, the body of chambers 600*a* and 600*b* of FIG. 5 include a polygonal container having a first side longer than a second side to maximize the spatial use so that more process chambers can be provided in a limited space environment such as the cluster system 10 of FIG. 5.

Referring to FIG. 5, the system 10 for depositing an organic material according to the third embodiment of the present invention is implemented as a cluster type system including a plurality of process chambers 600*a*, 600*b*, 700*a* and 700*b* for performing the deposition process of an organic material, a transfer chamber 20 for commonly connecting each of process chambers 600*a*, 600*b*, 700*a* and 700*b*, and load lock chambers 30 and 32 for loading and/or unloading substrates 110, 110', and 110" inserted into the process chambers through the transfer chamber. A shadow mask unit 40 may be further provided at a side of the transfer chamber 20 to be used during the deposition process in the process chambers 600*a*, 600*b*, 700*a* and 700*b*.

The process chambers 600*a*, 600*b*, 700*a* and 700*b* are organic material deposition apparatuses where the deposition process of an organic material is performed and include process chambers 600*a* and 600*b* that each perform a deposition process on at least two substrates and process chambers 700*a* and 700*b* that perform a deposition process on a single substrate. That is, in the third embodiment of FIG. 5, first and second process chambers 600*a* and 600*b* each perform the deposition process of two substrates and are implemented such that the deposition process is performed with respect to one substrate while transfer and alignment processes on the other substrate are being performed. In this case, the first and second process chambers 600*a* and 600*b* are implemented as in the second embodiment of the organic material deposition apparatus as described with reference to FIGS. 3 through 4D. The third and fourth process chambers 700*a* and 700*b* sequentially perform the alignment and deposition process of a single substrate, respectively.

In the cluster type deposition system according to the third embodiment of the present invention, the first and second process chambers 600*a* and 600*b* are implemented as a polygonal container having first and second sides with different lengths so that space occupied by the first and second process chambers 600*a* and 600*b* can be remarkably reduced and the third and fourth process chambers 700*a* and 700*b* can be further provided. In addition, deposition yield is considerably improved over earlier deposition systems.

The respective process chambers 600*a*, 600*b*, 700*a* and 700*b* may deposit additional organic materials on the substrate respectively or may deposit a same organic material on the substrate. For example, in the embodiment of FIG. 5, a first organic material is deposited in the first and third process chambers 600*a* and 700*a* and a second organic material is deposited in the second and fourth process chambers 600*b* and 700*b*.

The substrate on which the deposition process of the first organic material is completed in the first process chamber 600*a* is transferred to the second process chamber 600*b* and then the second organic material is further deposited. Similarly, the substrate on which the deposition of the first organic material is completed in the third process chamber 700*a* is transferred to the fourth process chamber 700*b* and the second organic material is further deposited in the fourth process chamber 700*b*.

The transfer chamber 20 is connected to the above-mentioned process chambers 600*a*, 600*b*, 700*a* and 700*b*, the load lock chambers 30 and 32, and the shadow mask unit 40 through side wall regions of the transfer chamber 20. In this case, penetration portions 24 are provided to allow the substrate to enter and exit in the respective side wall regions.

That is, the transfer chamber 20 includes a body 22 having a transferring space for substrate transfer and a pair of robot arms 26 and 26' provided in the body 22. The pair of robot arms 26 and 26' transfers the substrate provided in the load lock chamber 30 to one of the process chambers 600*a*, 600*b*, 700*a* and 700*b* or transfers and carries the substrate on which the first deposition is performed by process chamber 600*a* or 700*a* to another process chamber 600*b* or 700*b* or the load lock chamber 32. The load lock chambers 30 and 32, as described above, loads and/or unloads the substrates 110, 110', and 110" inserted into the process chamber.

In the third embodiment of the present invention, at least two robot arms 26 and 26' are provided in the body 22 of the transfer chamber 20 so that the second substrate 110' can be transferred to the process chamber 600*a* or 600*b* while the deposition process of the first substrate 110 is being carried out.

Operation of the organic material deposition system 10 according to the third embodiment of the present invention will be described in brief as follows. First, when a plurality of substrates are transferred from an external carrier apparatus (not shown) to the first load lock chamber 30, the first load lock chamber 30 loads the transferred substrates.

When the loading of the substrates is completed, a door (not shown) of the first load lock chamber 30 is closed and the first load lock chamber 30 is vacuumed. After that, the first robot arm 26 of the transfer chamber 20 transfers the first substrate 110 among the substrates to the first process chamber 600*a* through the transfer chamber 20. In this case, processes in the first process chamber 600*a* and the second process chamber 600*b* are identical to the deposition process performed by the organic material deposition apparatus of the chamber 600 of FIGS. 3 through 4D, and will be described in brief as follows.

The first substrate 110 transferred to the first process chamber 600*a* is aligned in the first process chamber 600*a*. When the alignment process is completed, the deposition process on the first substrate 110 is performed. That is, the first organic material is deposited on the first substrate 110.

The second substrate 110', among the plurality of substrates loaded in the first load lock chamber 30, is transferred by the second robot arm 26' to the first process chamber 600a at the same time that the first organic material is being deposited onto the first substrate 110 in the first process chamber 600a. That is, when the deposition process on the first substrate 100 is being carried out in the first process chamber 600a, the transfer and the alignment processes of the second substrate 110' are performed in the first process chamber 600a. The deposition process on the second substrate 110' is performed after the alignment process is completed.

The first substrate 110, on which the deposition process is completed, is transferred to the second process chamber 600b by the first robot arm 26. Accordingly, the first substrate 110 is aligned in the second process chamber 600b and the deposition of the second organic material onto the first substrate 110 is carried out upon completion of the alignment process of first substrate 110 in process chamber 600b.

After the first substrate 110 enters the second process chamber 600b, the second substrate 110', upon which the deposition process is completed in the first process chamber 600a, is transferred by the second robot arm 26' from the first process chamber 600a to the second process chamber 600b during the deposition process of the second organic material onto the first substrate 110 within the second process chamber 600b.

That is, the transfer and the alignment processes of the second substrate 110' are performed in the second process chamber 600b at the same time that the deposition process of the second organic layer is being carried out on the first substrate 110 within the second process chamber 600b.

By doing so, when the deposition processes of the first and second organic materials on the first and second substrates 110 and 110' are completed, the first and second substrates 110 and 110' are continuously transferred to the second load lock chamber 32 by the robot arm 26 or 26' and are unloaded respectively.

While the first and second substrates 110 and 110' are being processed in process chambers 600a and 600b, process chambers 700a and 700b can process third substrate 100". This begins with the first or second robot arm 26 or 26' transferring the third substrate 110" among the substrates loaded in the first load lock chamber 30 to the third process chamber 700a through the transfer chamber 20. After that, the third substrate 110" is aligned in the third process chamber 700a. When the alignment process is completed, the deposition process of the first organic material on the third substrate 110" is carried out. When the deposition process of the third substrate 110" is completed, a robot arm 26 or 26' transfers the third substrate 110" to the fourth process chamber 700b, and the third substrate 110" is aligned within the fourth process chamber 700b. When the alignment process is completed, a second organic material is deposited onto the third substrate 110". After that, when the deposition processes of the first and second organic materials on the third substrate 110" are completed, the third substrate 110" is transferred to the second load lock chamber 32 and is unloaded by a robot arm 26 or 26'.

At this time, the deposition processes of the third substrate 110", that is, the deposition processes performed in the third and fourth process chambers 700a and 700b, may be performed simultaneously with the deposition processes on the first and second substrates 110 and 110'.

Consequently, according to the organic material deposition system 10 in accordance with the third embodiment of the present invention, the deposition processes with respect to three substrates can be performed at the same time so that standby time in the respective process chambers can be reduced and productivity and throughput can be increased and maximized.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of depositing an organic material, comprising:
providing a first polygonal chamber having an interior divided into a first substrate deposition area and a second substrate deposition area;
transferring a first substrate into the first substrate deposition area of the first polygonal chamber and performing an alignment process on the first substrate;
transferring a deposition source to the first substrate deposition area;
performing a deposition process of a first material on the first substrate after completion of the alignment process on the first substrate by reciprocating the deposition source within the first substrate deposition area;
transferring a second substrate into the second substrate deposition area of the first polygonal chamber and performing an alignment process on the transferred second substrate while the deposition process on the first substrate is being performed;
transferring the deposition source to the second substrate deposition area from the first deposition area along a curved path when the deposition process on the first substrate and the alignment process on the second substrate are completed; and
performing a deposition process of the first material on the second substrate by reciprocating the deposition source within the second substrate deposition area, wherein directions of the reciprocating of the deposition source within each of the first and second deposition areas are along linear paths that intersect the curved path.

2. The method of claim 1, further comprising transferring a third substrate into the first substrate deposition area of the first polygonal chamber and performing an alignment process with respect to the third substrate while performing the deposition process of the first material with respect to the second substrate.

3. The method of claim 1, wherein the first chamber includes a first side that is longer than a second and opposite side, the first side including a first transferring unit having a curved shape corresponding to the curved path taken by the deposition source, wherein the first and second substrates enter and exit the first chamber via the second side.

4. The method of claim 1, further comprising:
transferring a third substrate into a second chamber to perform a deposition process thereon; and
transferring a fourth substrate into the second chamber to perform a deposition process thereon after completion of the deposition process on the third substrate, wherein the deposition processes on the third and fourth substrates in the second chamber are performed simultaneously to the deposition processes on the first and second substrates in the first chamber, the second chamber to process only a single substrate at a time.

5. The method of claim 4, wherein the deposition processes performed on each of the first through fourth substrates is identical and the first material is deposited onto the third and fourth substrates in the second chamber.

6. The method of claim 4, wherein a second and different deposition material is deposited onto each of the third and the fourth substrates within the second chamber.

7. The method of claim 1, further comprising:
providing a second polygonal chamber having an interior divided into a first substrate deposition area and a second substrate deposition area;
transferring a third substrate into the first substrate deposition area of the second polygonal chamber and performing an alignment process on the third substrate;
transferring a deposition source to the first substrate deposition area;
performing a deposition process on the third substrate after completion of the alignment process on the third substrate by reciprocating the deposition source back and forth within the first substrate deposition area;
transferring a fourth substrate into the second substrate deposition area of the second chamber and performing an alignment process on the transferred fourth substrate while the deposition process on the third substrate is being performed;
transferring the deposition source to the second substrate deposition area from the first deposition area along a curved path when the deposition process on the third substrate and the alignment process on the fourth substrate are completed; and
performing a deposition process on the fourth substrate by reciprocating the deposition source back and forth within the second substrate deposition area, wherein directions of reciprocating the deposition source within each of the first and second deposition areas are along linear paths that intersect the curved path.

8. The method of claim 7, wherein the transfer, alignment and deposition processes on the third and fourth substrates within the second chamber are performed simultaneous to the transfer, alignment and deposition processes on the first and second substrates within the first chamber.

9. The method of claim 1, further comprising:
providing a second polygonal chamber having an interior divided into a first substrate deposition area and a second substrate deposition area, the first and second polygonal chambers being commonly connected to a transfer chamber in a cluster type system;
removing the first and second substrates from the first chamber;
transferring the first substrate into the first substrate deposition area of the second polygonal chamber and performing an alignment process on the first substrate;
transferring a deposition source to the first substrate deposition area;
performing a deposition process of a second and different material on the first substrate after completion of the alignment process on the first substrate by reciprocating the deposition source within the first deposition area of the second chamber;
transferring a fourth substrate into the second substrate deposition area of the second chamber and performing an alignment process on the transferred fourth substrate while the deposition process on the third substrate is being performed;
transferring the deposition source to the second substrate deposition area from the first deposition area along a curved path when the deposition process on the third substrate and the alignment process on the fourth substrate are completed; and
performing a deposition process of the second and different material on the fourth substrate by reciprocating the deposition source back and forth within the second substrate deposition area of the second polygonal chamber, wherein the directions of reciprocating the deposition source within each of the first and second deposition areas are along linear paths that intersect the curved path.

10. The method of claim 9, further comprising:
providing a third chamber and a fourth chamber commonly connected to the transfer chamber and being in the cluster type system together with the first and second chambers, the third chamber including a deposition source to deposit the first material, and the fourth chamber including a deposition source to deposit the second material;
transferring a third substrate to the third chamber;
depositing the first material onto the third substrate within the third chamber;
transferring the third substrate from the third chamber to the fourth chamber; and
depositing the second material onto the third substrate in the fourth chamber, wherein the processing of the third substrate being performed simultaneously with the processing of the first and second substrates.

11. The method of claim 1, wherein a direction of the reciprocating of the deposition source within the first substrate deposition area forms an oblique angle with a direction of the reciprocating of the deposition source within the second substrate deposition area.

12. The method of claim 3, wherein both the first and second substrate deposition areas are arranged on a same side of the curved path.

13. A method of depositing an organic material, comprising:
positioning a deposition source within a standby area between a first deposition area and a second deposition area of a first chamber while a first substrate is transferred from an outside into the first substrate deposition area of the first chamber and while an alignment process is being performed on the first substrate;
transferring the deposition source in a first direction from the standby area to within the first deposition area upon completion of the transferring and alignment of the first substrate;
performing a deposition process with respect to the first substrate by reciprocating the deposition source in the first direction within the first deposition area;
transferring a second substrate from an outside into the second substrate deposition area and performing an alignment process with respect to the second substrate;
transferring the deposition source in the first direction from the first substrate deposition area back to the standby area of the first chamber after the deposition process with respect to the first substrate is completed;
transferring the deposition source in the first direction from the standby area to the second deposition area upon completion of the transferring and alignment of the second substrate; and
performing a deposition process with respect to the second substrate by reciprocating the deposition source in the first direction within the second deposition area.

14. The method of claim 13, wherein the alignment process with respect to the second substrate is performed while the deposition process is being performed with respect to the first substrate.

15. The method of claim 13, further comprising:
transferring the first substrate from the first substrate deposition area of the chamber to the outside upon completion of the deposition process on the first substrate while the deposition source is arranged within the standby area; and
transferring a third substrate into the first substrate deposition area of the chamber from the outside during the deposition with respect to the second substrate.

16. The method of claim 13, further comprising a deposition source holding unit to hold the deposition source, the deposition source holding unit comprising an angle limiting plate arranged on the upper outer wall of the deposition source holding unit, the angle limiting plate to limit but not eliminate a spray direction of an organic material sprayed from the deposition source and to prevent the organic material from being sprayed into either of the first and second substrate deposition areas when the deposition source is arranged within the standby area.

17. The method of claim 16, wherein the angle limiting plate continues to limit a spray direction of an organic material sprayed from the deposition source while the deposition source is arranged within the first deposition area and depositing the first material onto the first substrate.

18. The method of claim 16, wherein the angle limiting plate continues to limit to a same degree a spray direction of an organic material sprayed from the deposition source while the deposition source is arranged within the first and second deposition areas and is depositing the first material onto the first and second substrates respectively as compared to when the deposition source is arranged within the standby area.

19. The method of claim 16, wherein the deposition source and the deposition source holding unit remain stationary within the standby area until the transferring and alignment of the first substrate within the first substrate deposition area is complete.

20. The method of claim 13, wherein the standby area is arranged in between the first and second deposition areas and is arranged on a straight line connecting the first substrate deposition area to the second substrate deposition area.

* * * * *